(12) United States Patent
Huber et al.

(10) Patent No.: US 11,476,389 B2
(45) Date of Patent: Oct. 18, 2022

(54) METHOD FOR PRODUCING AN OPTOELECTRONIC SEMICONDUCTOR CHIP HAVING STRUCTURES AT THE RADIATION PASSAGE SURFACE, AND OPTOELECTRONIC SEMICONDUCTOR CHIP HAVING STRUCTURES AT THE RADIATION PASSAGE SURFACE

(71) Applicant: OSRAM OLED GmbH, Regensburg (DE)

(72) Inventors: Michael Huber, Bad Abbach (DE); Jana Sommerfeld, Regensburg (DE); Martin Herz, Altdorf (DE); Sebastian Hoibl, Kiefersfelden (DE); Christian Rumbolz, Lappersdorf (DE); Albrecht Kieslich, Radebeul (DE); Bernd Boehm, Obertraubling (DE); Georg Rossbach, Regensburg (DE); Markus Broell, Unterhaching (DE)

(73) Assignee: OSRAM OLED GmbH, Regensburg (DE)

( * ) Notice: Subject to any disclaimer, the term of this patent is extended or adjusted under 35 U.S.C. 154(b) by 152 days.

(21) Appl. No.: 16/644,962

(22) PCT Filed: Sep. 3, 2018

(86) PCT No.: PCT/EP2018/073625
§ 371 (c)(1),
(2) Date: Mar. 6, 2020

(87) PCT Pub. No.: WO2019/048385
PCT Pub. Date: Mar. 14, 2019

(65) Prior Publication Data
US 2021/0126163 A1    Apr. 29, 2021

(30) Foreign Application Priority Data

Sep. 6, 2017  (DE) .................... 10 2017 120 493.8
Sep. 12, 2017 (DE) .................... 10 2017 121 028.8
Mar. 29, 2018 (DE) .................... 10 2018 107 615.0

(51) Int. Cl.
*H01L 33/24* (2010.01)
*H01L 33/00* (2010.01)

(52) U.S. Cl.
CPC .......... *H01L 33/24* (2013.01); *H01L 33/0062* (2013.01)

(58) Field of Classification Search
CPC ..................................... H01L 33/22
See application file for complete search history.

(56) References Cited

U.S. PATENT DOCUMENTS 10,866,343 B2 * 12/2020 Noda ............. H01L 31/054
2004/0207310 A1 * 10/2004 Erchak ............ H01L 33/30
                                                        313/498

(Continued)

FOREIGN PATENT DOCUMENTS

DE        10340271 A1    4/2005
DE    102006017573 A1    10/2007

(Continued)

OTHER PUBLICATIONS

Schnurmann et al. (The Weighted Random Test-Pattern Generator, C-24, No. 7 IEEE Transactions on Computers, 695, Jul. 1975) (Year: 1975).*

(Continued)

*Primary Examiner* — Stephen M Bradley
(74) *Attorney, Agent, or Firm* — Viering, Jentschura & Partner Mbb

(57) ABSTRACT

The invention relates to a method for producing an optoelectronic semiconductor chip comprising the following (Continued)

steps: providing a semiconductor body (1) having a radiation-permeable surface (1a), and introducing structures (2) into the semiconductor body (1) on the radiation-permeable surface (1a), wherein the structures (2) are quasi-regular.

17 Claims, 7 Drawing Sheets

(56) References Cited

U.S. PATENT DOCUMENTS

| | | |
|---|---|---|
| 2006/0237734 A1 | 10/2006 | Baur et al. |
| 2008/0035953 A1 | 2/2008 | Beom et al. |
| 2008/0277679 A1* | 11/2008 | Akimoto ................ H01L 33/20 257/94 |
| 2009/0087994 A1 | 4/2009 | Lee et al. |
| 2010/0308359 A1* | 12/2010 | Singh .................... H01L 33/20 257/98 |
| 2012/0001152 A1* | 1/2012 | Kim ...................... H01L 33/20 257/13 |
| 2014/0014974 A1 | 1/2014 | Chang et al. |
| 2014/0162386 A1* | 6/2014 | Huang .................. H01L 33/22 438/29 |
| 2016/0056352 A1* | 2/2016 | Koike ................... H01L 33/58 438/27 |
| 2017/0148930 A1* | 5/2017 | Zhu ....................... H01L 33/22 |
| 2018/0136377 A1* | 5/2018 | Behounek ........... G02B 19/0047 |

FOREIGN PATENT DOCUMENTS

| | | |
|---|---|---|
| DE | 102008021621 A1 | 11/2009 |
| EP | 1271665 A2 | 1/2003 |

OTHER PUBLICATIONS

International Search Report issued in the couterpart international Application No. PCT/EP2018/073625, 3 pages, dated Oct. 26, 2018 (for reference purpose only).

German Search Report issued in the counterpart German Application No. 10 2018 107 615.0, 8 pages, dated Nov. 13, 2018 (for reference purpose only).

* cited by examiner

METHOD FOR PRODUCING AN OPTOELECTRONIC SEMICONDUCTOR CHIP HAVING STRUCTURES AT THE RADIATION PASSAGE SURFACE, AND OPTOELECTRONIC SEMICONDUCTOR CHIP HAVING STRUCTURES AT THE RADIATION PASSAGE SURFACE

CROSS-REFERENCE TO RELATED APPLICATIONS

The present application is a national stage entry according to 35 U.S.C. § 371 of PCT application No. PCT/EP2018/073625 filed on Sep. 3, 2018; which claims priority to German application No. 10 2017 120 493.8 filed on Sep. 6, 2017, as well as German application No. 10 2017 121 028.8 filed on Sep. 12, 2017, as well as German application No. 10 2018 107 615.0 filed on Mar. 29, 2018; all of which are incorporated herein by reference in their entirety and for all purposes.

TECHNICAL FIELD

A method for producing an optoelectronic semiconductor chip and also an optoelectronic semiconductor chip are specified.

BACKGROUND

One object to be achieved is to specify a method for producing an optoelectronic semiconductor chip having improved optical properties, which method can be carried out cost-effectively, in particular. A further object to be achieved is to specify an optoelectronic semiconductor chip having improved optical properties.

SUMMARY

Firstly, a method for producing an optoelectronic semiconductor chip is specified. The optoelectronic semiconductor chip is, in particular, a radiation-emitting semiconductor chip that emits electromagnetic radiation, in particular light, during operation. By way of example, the optoelectronic semiconductor chip is a light-emitting diode chip.

In accordance with at least one embodiment of the method for producing an optoelectronic semiconductor chip, firstly a semiconductor body having a radiation passage surface is provided. The semiconductor body can be provided for example by epitaxial growth on a substrate. The substrate can be removed from the semiconductor body and the semiconductor body is arranged on a carrier or an auxiliary carrier, for example.

The semiconductor body includes for example a first conducting region, which is embodied as p-conducting, for example, and a second conducting region, which is embodied as n-conducting, for example. An active region can be arranged between the two conducting regions. The active region is configured for generating radiation during operation of the completed semiconductor chip. That is to say that during operation of the finished optoelectronic semiconductor chip, electromagnetic radiation, for example light, is generated in the active region and leaves the semiconductor body through the radiation passage surface of the semiconductor body. The radiation passage surface is given for example by a main surface, for example a top surface, of the semiconductor body that closes off the second conducting region of the semiconductor body toward the outside.

The semiconductor body is based on a III-V compound semiconductor material, for example. A III/V compound semiconductor material includes at least one element from the third main group, such as B, Al, Ga, In, for example, and an element from the fifth main group, such as N, P, As, for example. In particular, the term "III/V compound semiconductor material" encompasses the group of binary, ternary or quaternary compounds which contain at least one element from the third main group and at least one element from the fifth main group, for example nitride and phosphide compound semiconductors. Such a binary, ternary or quaternary compound may moreover include for example one or more dopants and additional constituents. In particular, it is possible for the semiconductor body to be based on a nitride compound semiconductor material or a phosphide compound semiconductor material.

In accordance with at least one embodiment of the method, structures are introduced into the semiconductor body at the radiation passage surface. The structures are introduced into the semiconductor body for example by means of a material-removing method at the radiation passage surface. The structures can be introduced into the semiconductor body for example by means of dry-chemical or wet-chemical etching.

The structures are formed for example in the second conducting region of the semiconductor body. The structures can consist, in particular, of the material of the semiconductor body.

In accordance with at least one embodiment of the method, structures are applied to the semiconductor body at the radiation passage surface of the semiconductor body. By way of example, for this purpose, a further material different than the material of the semiconductor body is applied to the radiation passage surface of the semiconductor body, for example as a layer. Afterward, the structures are introduced into said layer by means of dry-chemical or wet-chemical etching. Furthermore, it is possible for the structures to be applied to the semiconductor body by means of application techniques such as vapor deposition or sputtering through a correspondingly structured mask.

Electromagnetic radiation that leaves or penetrates into the semiconductor body through the radiation passage surface then passes at least partly through the structures.

At least one embodiment involves exposing structures in the semiconductor body at the radiation passage surface. By way of example, the structures are created as early as during the epitaxial growth of the semiconductor body on the substrate. For this purpose, by way of example, the growth surface of the substrate can be correspondingly structured or a correspondingly structured growth mask is arranged between the substrate and the semiconductor body. When the substrate is detached, for example by means of etching or a laser lift-off method, the structures introduced into the semiconductor body in this way can then be exposed.

In the method described here, it is moreover possible for structures to be present in the semiconductor body which are introduced and/or applied and/or exposed there. That is to say that the different ways of producing the structures in the semiconductor body are combinable.

In accordance with at least one embodiment of the method, the structures are arranged in quasi-regular fashion. In this case, "in quasi-regular fashion" means, for example, that the size of the structures, for example their diameter, their height and/or their volume, is not identical for all the structures, but rather fluctuates by a specific value, for example by an average value of the aforementioned sizes.

Additionally or alternatively, "in quasi-regular fashion" can mean that the structures are not arranged at the same distances from one another, for example at the lattice points of a regular lattice, rather the positions of the structures fluctuate for example around the lattice points of a regular lattice. That is to say that the structures are then not arranged at the lattice points of a regular two-dimensional lattice, for example, rather the position of individual structures can be displaced by pre-definable values in comparison with the regular arrangement. The position of one of the structures can be determined for example by the position of a distinguished point or a distinguished location of the structure. For example, the structures each have a vertex, wherein the position of the vertex of a structure determines the position of said structure in a plane parallel to the principal plane of extent of the radiation passage surface of the semiconductor body. Furthermore, it is possible for the structures to have an axis of symmetry and for the point of intersection of the axis of symmetry with a plane parallel to the principal plane of extent of the radiation passage surface of the semiconductor body to define the position of the structures.

Furthermore, it is possible for structures of different types to be present. By way of example, the structures of different types can differ from one another with regard to the structure size, which is defined for example by the structure height or the diameter, or with regard to their shape. Structures of different types can be arranged for example in quasi-regular fashion around the lattice points of different lattices that are displaced with respect to one another. In this regard, it is possible, for example, for structures of a first type, which are embodied as larger, for example, to be arranged in quasi-regular fashion at the lattice points of a main lattice, whereas smaller structures are arranged in quasi-regular fashion at the lattice points of a sublattice that is displaced with respect to the main lattice. In this way, by way of example, an emission characteristic of a radiation-emitting semiconductor chip can be set particularly accurately. In this case, it is possible for two or more types of structures to be arranged in quasi-regular fashion at the lattice points of two or more lattices.

Structure sizes of the structures, such as, for example, the diameter of the structures at their widest location in a plane parallel to the principal plane of extent of the radiation passage surface of the semiconductor body, are of the order of magnitude of the wavelength of the electromagnetic radiation generated in the active region during operation. By way of example, the diameter of the structures is on average between at least the dominant wavelength itself of the electromagnetic radiation generated during operation and at most twenty times the dominant wavelength of the electromagnetic radiation generated during operation. In this way, the structures are particularly well suited to reducing a probability of total internal reflection at the radiation passage surface of the semiconductor body.

In accordance with at least one embodiment, a method for producing an optoelectronic semiconductor chip including the following steps is specified:

providing a semiconductor body having a radiation passage surface, and introducing structures into the semiconductor body at the radiation passage surface, and/or applying structures to the semiconductor body at the radiation passage surface, and/or exposing structures in the semiconductor body at the radiation passage surface, wherein the structures are arranged in quasi-regular fashion.

Furthermore, an optoelectronic semiconductor chip is specified. An optoelectronic semiconductor chip described here can be produced in particular by means of a method described here, and so all features disclosed for the method are also disclosed for the semiconductor chip, and vice versa.

In accordance with at least one embodiment, an optoelectronic semiconductor chip is specified including a semiconductor body including a radiation passage surface and structures at the radiation passage surface, wherein the structures are arranged in quasi-regular fashion.

A method described here and also an optoelectronic semiconductor chip described here are based on the following considerations, inter alia:

In order to optimize the output coupling efficiency of optoelectronic components, it is advantageous to structure the radiation passage surface, since otherwise total internal reflection occurs at the radiation passage surface for a large range of solid angles, which results in losses of efficiency. This can be realized such that the semiconductor body, for example in the form of a wafer, is immersed in a wet chemical, for example KOH.

Reliable, reproducible and maximal output coupling is possible only with great outlay using wet-chemical roughening. For each new development of a semiconductor chip, the roughening optimum has to be redefined by multiple roughening and removal measurement. Excess roughening naturally occurs and results in losses of yield. Moreover, the wet chemical can cause undesired side effects such as further incipient etches, which restricts the design freedom.

Alternatively, there is the possibility of periodic roughening by means of phototechnology and dry-chemical etching. This overcomes the disadvantages of wet-chemical roughening, but leads to a new problem: the strict periodicity of the structures results in geometric effects, as a result of which the emission intensity fluctuates at different solid angles. In addition, it can be observed that the emission characteristic changes greatly across the wafer since, as a result of the strict periodicity, even small fluctuations in the etching homogeneity result in severe fluctuations in the emission.

Surprisingly, it has been found that the quasi-regular arrangement of the structures, which is neither a completely random arrangement of the structures nor a completely regular, periodic arrangement of the structures, brings about a significant improvement in the homogeneity of the emission of the electromagnetic radiation through the radiation passage surface. In this regard, for example, the normalized brightness along a wafer with a multiplicity of semiconductor bodies is virtually constant for the case of structures arranged in quasi-regular fashion, whereas large fluctuations in the normalized brightness over the wafer result for a periodic arrangement of the structures. This has the effect that in the case of regular, periodically arranged structures, the brightness for different semiconductor chips from the same wafer assemblage and the brightness for semiconductor chips from different wafers can fluctuate very greatly. This results in an increased sorting outlay since the semiconductor chips have to be classified in accordance with their brightness, for example. Such expensive follow-up work can be obviated with a method described here for optoelectronic semiconductor chips described here.

The following embodiments relate both to the method described here and to the optoelectronic semiconductor chip described here.

In accordance with at least one embodiment of the method described here and of the semiconductor chip described here, the roughening is effected by means of phototechnology and dry-chemical roughening, but the structures are applied on the photomask in randomized fashion or in quasi-regular fashion, instead of periodically. This overcomes the disadvantages of wet-chemical roughening and the disadvantages of dry-chemical roughening with periodic structures.

In accordance with at least one embodiment, the structures are produced by wet-chemical etching using a correspondingly structured mask. In this way, it is possible, for example, to set the shape of the structures. During wet-chemical etching, for example, specific lattice planes of the semiconductor body can be fashioned such that the structures have a triangular or polygonal, for example hexagonal, shape in cross section parallel to the principal plane of extent of the semiconductor chip. In contrast thereto, dry-chemical etching of the structures results rather in a rounded outer shape of the structures, that is to say for example in structures embodied in a domelike fashion.

In accordance with at least one embodiment, positions of at least some of the structures, in particular of a large proportion of the structures, that is to say at least 50%, in particular at least 90%, or all the structures are displaced in comparison with positions of structures at lattice points of a regular lattice. In other words, the structures are not arranged at the lattice points of a regular lattice, but rather at a distance from the lattice points. In this way, the distances between adjacent structures fluctuate, such that the structures are not at uniform distances from one another.

In accordance with at least one embodiment of the method, each of the positions is displaced at most by a predefinable maximum value. That is to say that the displacement of the position from the position in a regular lattice is not arbitrarily large, but rather limited to a predefinable maximum value. As a result, it is possible to define an optimum maximum value for which, for example, the normalized brightness over a wafer is particularly uniform and/or the probability of emergence for electromagnetic radiation from the optoelectronic semiconductor chip is particularly high.

In accordance with at least one embodiment of the method, the maximum value is at least 10%, in particular at least 20% or exactly 20% of the average distance between mutually adjacent lattice points of the regular lattice. The average distance between mutually adjacent lattice points of the regular lattice can be, in particular, a lattice constant of the regular lattice. The maximum value by which each of the positions is at most displaced is a proportion of the average distance that is less than 100% and greater than 0%.

The maximum value can be used to stipulate how close to one another two adjacent structures can come or how far apart from one another two adjacent structures can be in the extreme case. If two adjacent structures come too close to one another, for example, then it is possible for a saddle point to form between the two structures, and said saddle point can be disadvantageous with regard to avoiding total internal reflection at the radiation passage surface. Furthermore, an excessively large distance between adjacent structures can likewise result in an excessively large, unstructured area between the structures and thus in a plateau, which can in turn be disadvantageous with regard to avoiding total internal reflection at the radiation passage surface. In particular, a maximum value of between at least 15% and at most 25% can be optimal with regard to avoiding formation of a plateau.

In accordance with at least one embodiment, the positions are displaced in a random manner. That is to say that the positions are not displaced from the lattice position by fixed values which are less than or equal to the maximum value, rather a displacement by a value that is less than or equal to the maximum value and is random takes place for each structure in the extreme case. "Random" here means that the value is defined for example by the random number generator of a computer.

In accordance with at least one embodiment of the method, the positions are displaced by a larger distance with a greater probability than by a smaller distance. That is to say that in this case, for displacing each structure, a random value between the minimum value of the displacement, for example zero, and the maximum value is not chosen in a uniformly distributed way, rather a larger value is chosen with greater probability than a smaller value. For this purpose, in the calculation of the random numbers, it is possible to use a weighting function which, plotted against the displacement, rises monotonically or strictly monotonically from the minimum value of the displacement to the maximum value of the displacement. In this way, for example, displacements by the maximum value are more probable than displacements by half the maximum value. By way of example, the weighting function can be a straight line which results in a probability of zero for a displacement by the distance zero, such that each structure is displaced from the position of the regular lattice. Furthermore, it is possible for the weighting function not to be embodied in a linear fashion, rather the weighting function can be described by some other mathematical function, for example a parabolic curve or a hyperbolic curve. Furthermore, it is possible to describe the weighting function by an n-th degree polynomial function where $n>0$. In this way, it is possible to control the quasi-regular distribution of the structures particularly accurately.

In accordance with at least one embodiment, the positions are displaced in each lateral direction with the same probability. That is to say that, in this embodiment, for the displacement of the structures from the positions of the regular lattice, there is no preferred direction in which displacement is effected to an increased extent, rather all lateral directions are treated equally. In this case, the lateral directions are the directions running parallel to a principal plane of extent of the radiation passage surface. This can be described for example by a weighting function which has the same value for all directions in the plane of the lateral directions.

In accordance with at least one embodiment, the structures are produced by dry-chemical etching using a correspondingly structured mask. That is to say that on the basis of, for example, the weighting functions described and a predefined regular, periodic arrangement of the structures, the displaced positions of the structures are calculated and a mask that is usable for photolithography is produced on the basis of this calculation. A photoresist layer, for example of uniform thickness, is applied to the semiconductor body, which is a wafer having a multiplicity of later semiconductor chips, for example, said photoresist layer being exposed by means of the mask. A, for example cylindrical, photoresist structure then arises on the wafer for each structure to be produced. The structures are subsequently produced by means of dry-chemical etching. In this case, as the etching duration increases, the photoresist structures become smaller and smaller; their diameter and their height decrease. This gives rise to structures which are domed and have a vertex where the photoresist is removed chronologically last or small amounts of photoresist remain.

In accordance with at least one embodiment, the structures are domes, elevations or recesses and each structure has a vertex, wherein the position of each structure is given by the position of its vertex. That is to say that the structures can also be recesses besides the domes and elevations, said recesses having an inverse shape with respect to the domes, for example. The vertex of the structure is situated where the side surfaces of the structures converge, said vertex forming the highest point of the structure in the case of the domes and elevations and the lowest point of the structure in the case of the recess. The vertex of the structure defines the position of the structure around which the structure extends in lateral directions.

In accordance with at least one embodiment, the height and/or the maximum diameter and/or the volume are/is different in pairs for at least some of the structures. This can be achieved by virtue of the fact that, in the mask described above, the structures are chosen with a different diameter, for example, and/or the photoresist layer has a different thickness at different positions. This can be effected in addition or as an alternative to the displacement of the position from the regular position.

By way of example, the height and/or the maximum diameter and/or the maximum volume, for at least some of the structures, in particular for all of the structures, then deviate(s) at least by 1%, in particular by at least 5%, from an average value of the stated value.

In accordance with at least one embodiment, the structures of the mask are not introduced by exposure, but rather by means of a stamping method. The stamping method can be, for example, a so-called nanoimprint method. By means of a stamping method, the structures can be positioned particularly accurately and it is possible to produce particularly small structures or structures having a defined outer surface.

In accordance with at least one embodiment, the structures have a refractive index which is less than the refractive index of a region of the semiconductor body that directly adjoins the structures, and the structures have a refractive index which is greater than the refractive index of a material surrounding the semiconductor body.

For example, the structures have a refractive index which is less than 2.4 and greater than 1.6 for electromagnetic radiation having a wavelength of 500 nm. The structures are then formed in particular with a material which is different than the material of the semiconductor body.

By way of example, the structures can be formed with at least one of the following materials, that is to say contain at least one of the following materials or consist of one of the following materials: NbO, $HfO_5$, $Ta_2O_5$.

Furthermore, it is possible for the structures to be formed with a transparent, electrically conductive material, for example a TCO material, such as ITO.

The semiconductor body can be surrounded by air or a potting material, which is formed with a plastic or glass, for example at its outer surfaces. The structures can then contribute to refractive index matching between the semiconductor material of the semiconductor body and the surrounding material.

In order to produce such structures, for example, an additive layer is introduced onto the semiconductor body at the radiation passage surface thereof, and is then structured by means of one of the techniques mentioned, that is to say etching or stamping, for example.

In accordance with at least one embodiment, at least some of the structures are covered with an antireflective layer. In particular, it is possible for all of the structures to be covered with an antireflective layer. The antireflective layer is an antireflection layer, for example, which may also include two or more sublayers. The antireflective layer ensures that the probability of total internal reflection when light emerges at the outer surface is reduced and, consequently, overall more light can leave the structures.

In accordance with at least one embodiment, at least some of the structures have a roughened outer surface. The roughened outer surface can be implemented for example by means of subsequent etching of the structures. The etching is effected wet-chemically, for example, and produces substructures at the outer surface of the structures, which are smaller than the actual structures. By way of example, such subsequent etching can be effected by means of nitric acid.

The method described here and the semiconductor chip described here are distinguished by the following advantages, inter alia:

reliable, reproducible and high output coupling is possible, with little fluctuation on the wafer and from wafer to wafer, in the case of a new development of semiconductor chips, it is not necessary for the roughening optimum to be redefined and developed, excess roughening and the associated loss of yield no longer occur, there is greater design freedom since undesired etches such as when a wet chemical is used are no longer possible, by means of the dry-chemical etching method, in particular, it is possible, in a targeted manner, to set the height, distance and degree of randomization of the individual structures, for example domes, crests, elevations, recesses, and thus to influence the emission characteristic.

The disclosure content of the patent claims is hereby expressly incorporated in the description as well.

The method described here and the optoelectronic semiconductor chip described here are explained in greater detail below on the basis of exemplary embodiments and with reference to the associated figures. Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or to afford a better understanding.

BRIEF DESCRIPTION OF THE DRAWINGS

It should be noted here that the features outlined in conjunction with the figures can be realized not only in the feature combinations described, but also by themselves or in other technically expedient combinations.

Elements which are the same or of the same type, or which have the same effect, are provided with the same references in the figures. The figures are respectively schematic representations and therefore not necessarily true to scale. Rather, relatively small elements, and in particular layer thicknesses, may be represented exaggeratedly large for illustration.

Figure 1A:
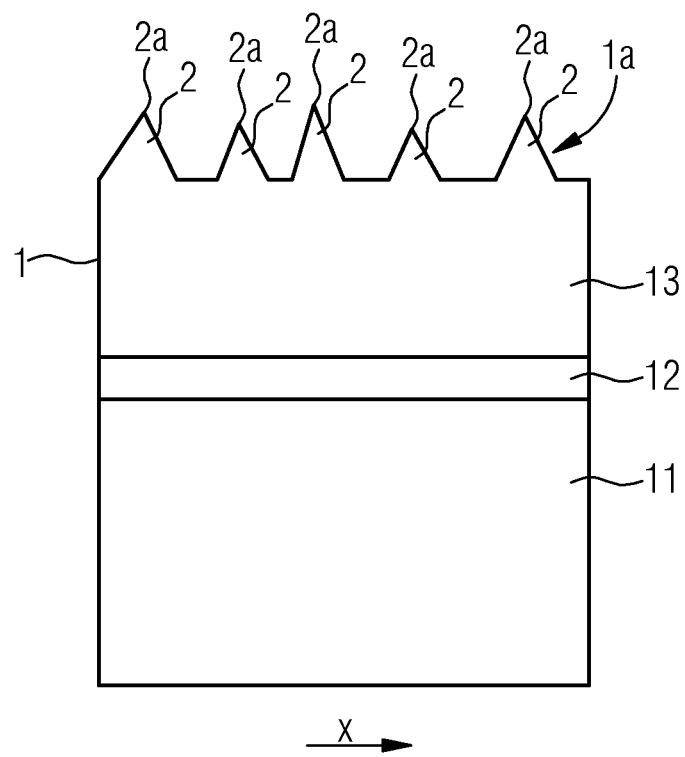
Figure 1B:
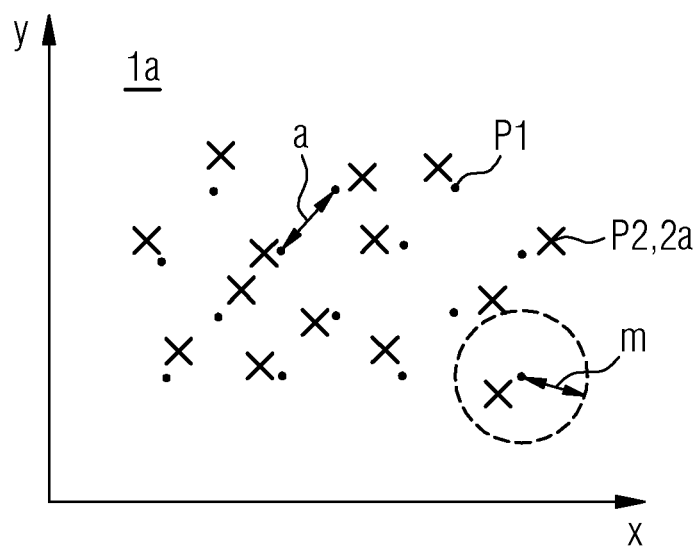
Figure 2A:
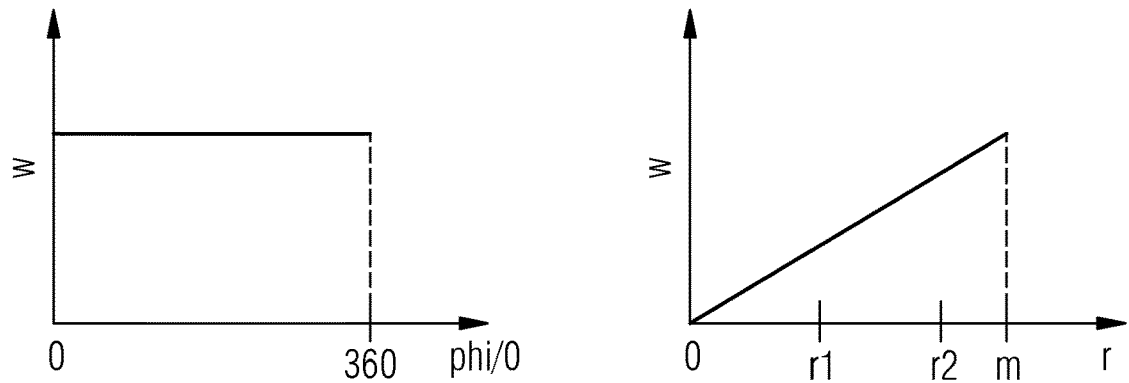
Figure 2B:
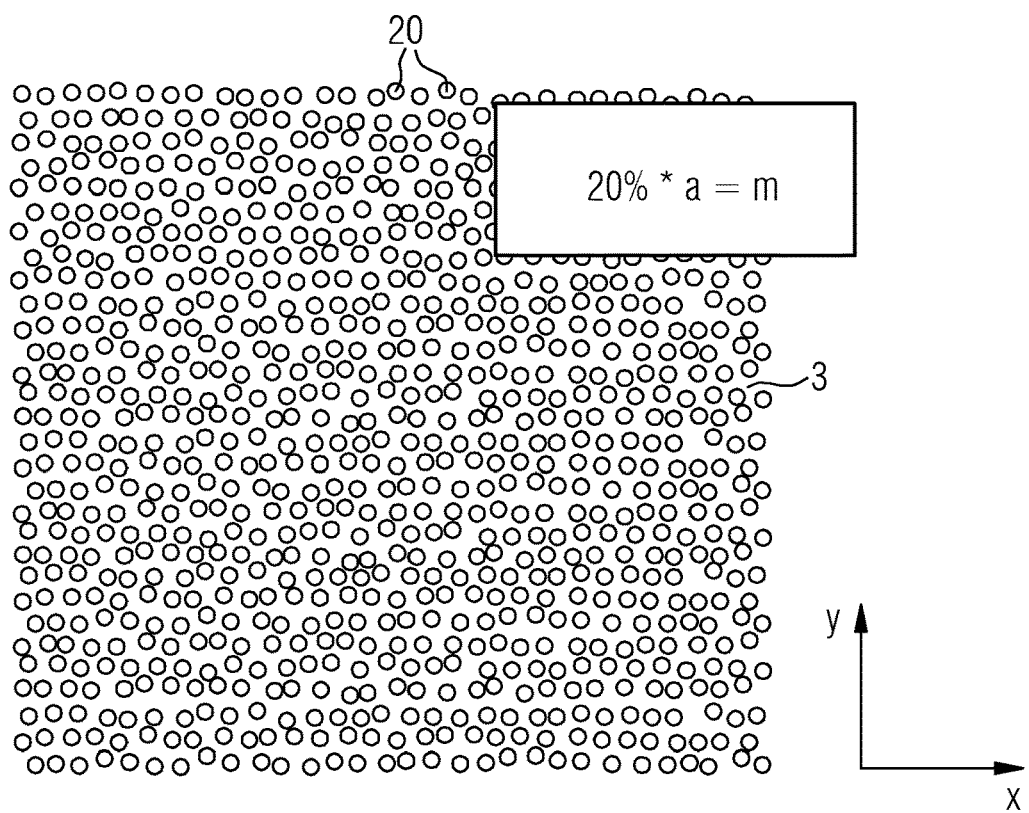
Figure 3:
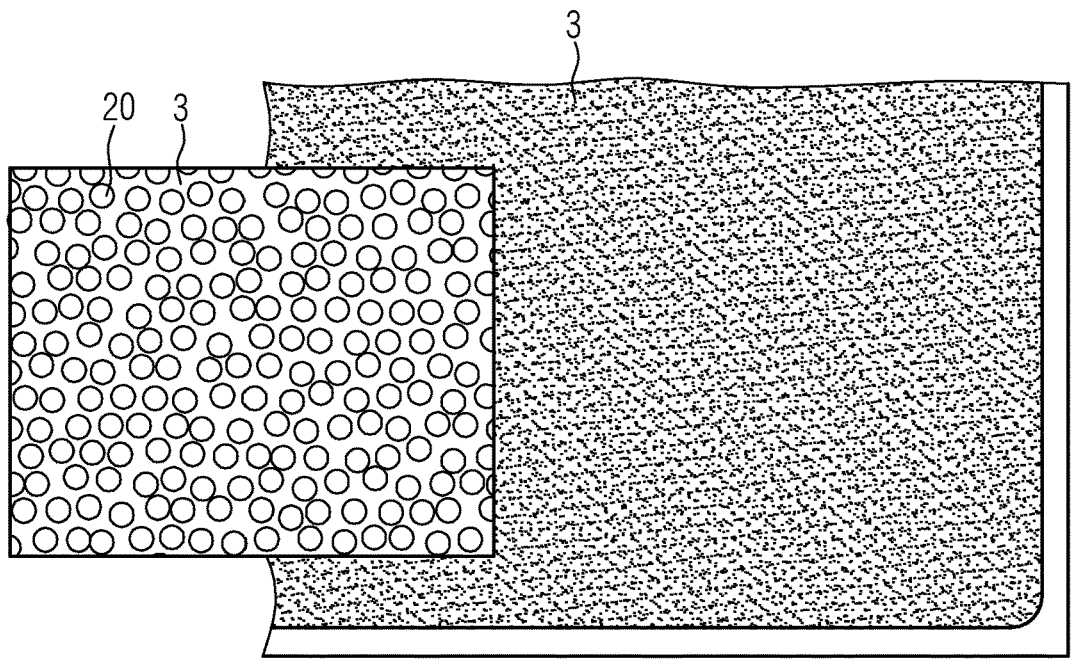
Figure 4:
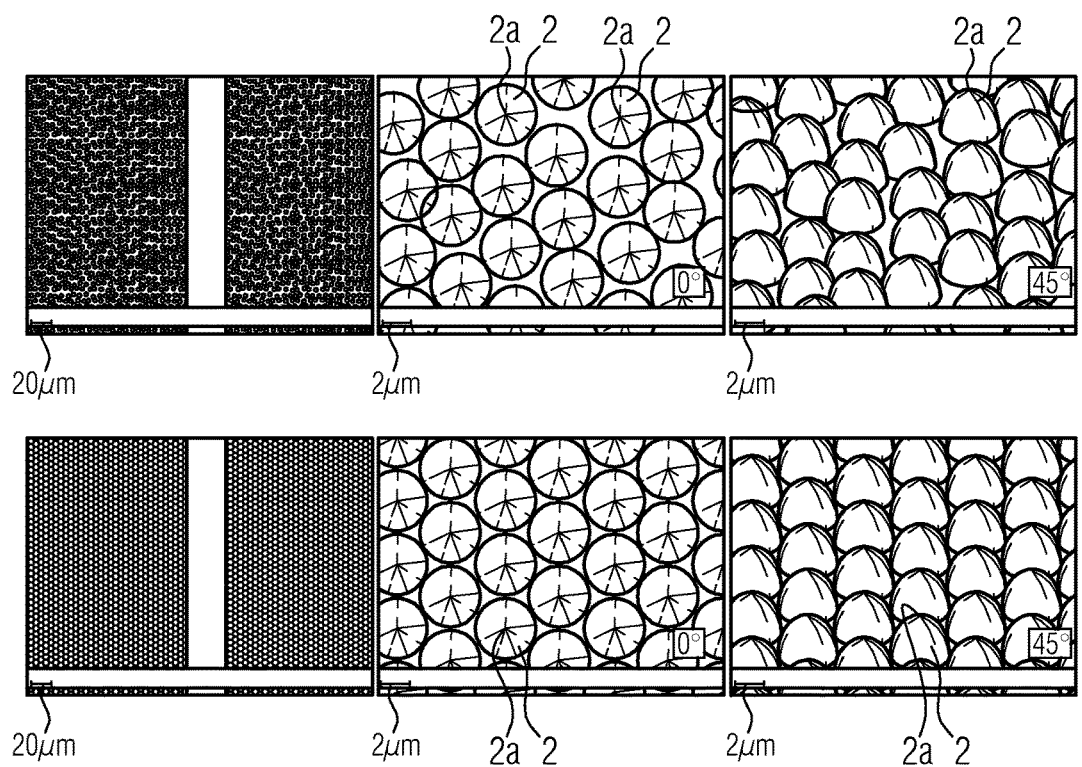
Figure 5:
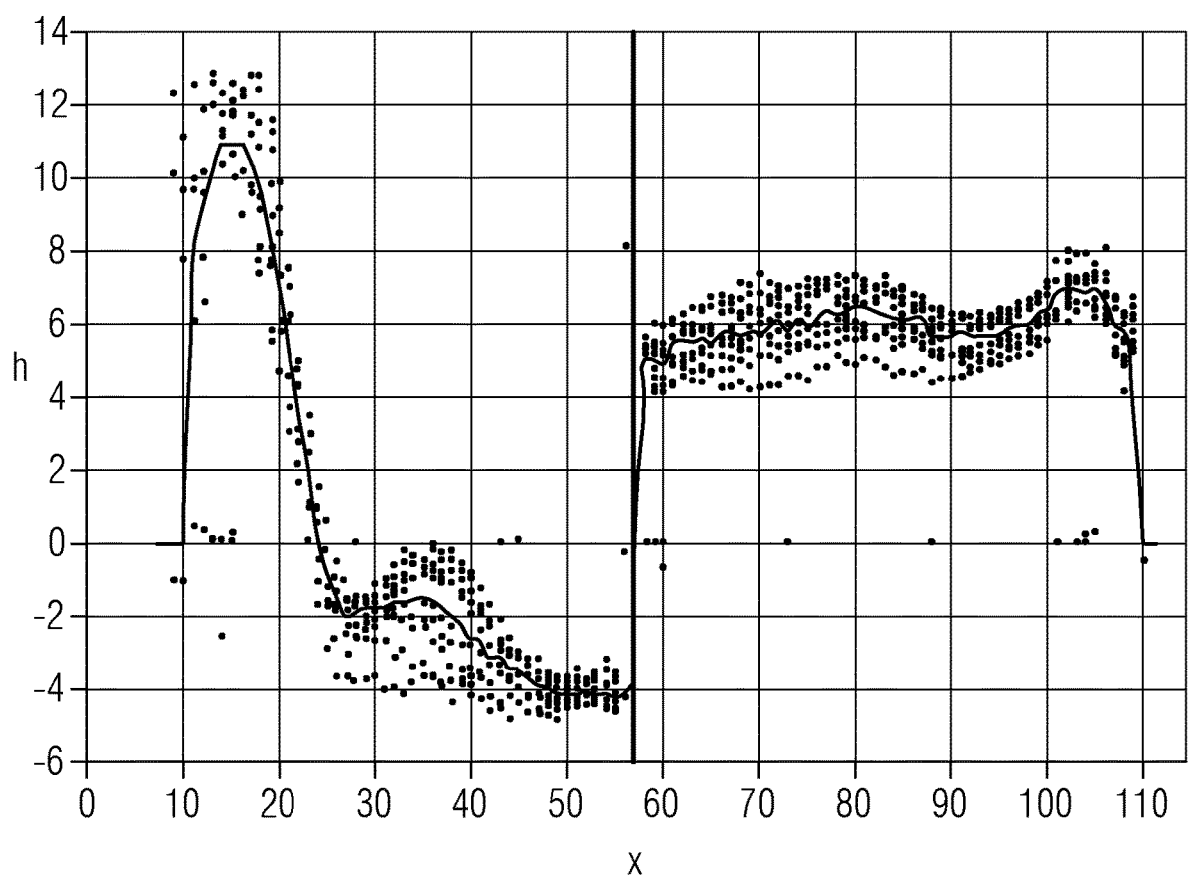
Figure 6A:
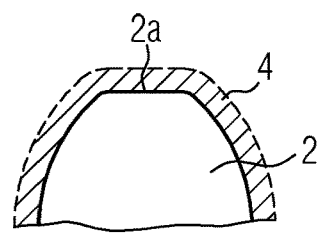
Figure 6B:
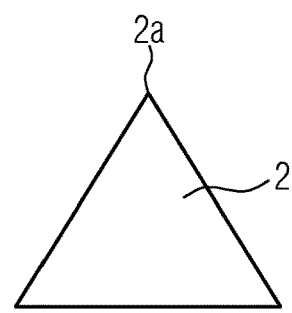
Figure 7A:
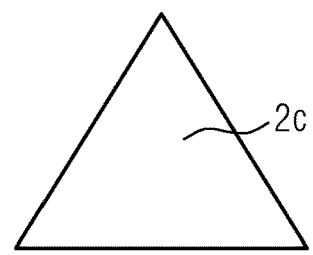
Figure 7B:
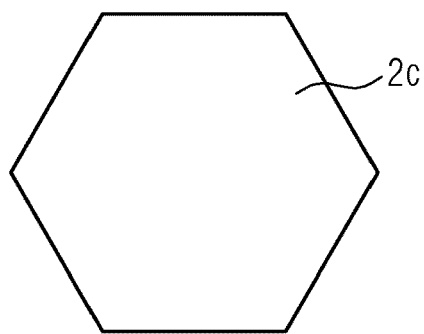
Figure 8:
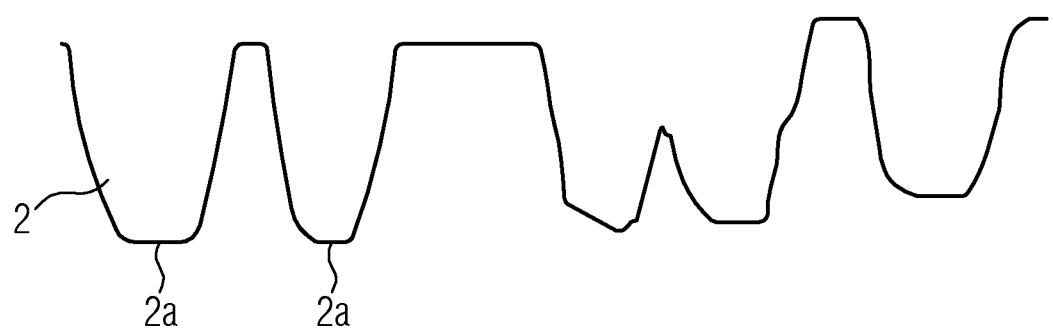

The figures will now be explained in greater detail:

FIG. 1A shows a schematic sectional illustration of a semiconductor chip;

FIG. 1B shows a plan view of the radiation passage surface of the semiconductor body shown in FIG. 1A;

FIG. 2A shows a graph depicting a weighting function w as a function of a lateral direction phi in angular degrees and a graph depicting a weighting function for a distance that rises along a straight line from zero for a displacement of zero up to a maximum value for a displacement;

FIG. 2B shows a simulation of the mask 3 with a randomized structure, said simulation resulting from the illustrations in FIG. 2A;

FIG. 3 shows an illustration of a finished mask design of a mask 3, on the basis of FIGS. 2A and 2B;

FIG. 4 shows the results of dry-chemical etching;

FIG. 5 shows an emission on a wafer in the case of a quasi-regular arrangement in accordance with the mask from FIG. 3;

FIGS. 6A and 6B each illustrate a structure having a different vertex;

FIGS. 7A and 7B illustrate different shapes for base surfaces of structures that can be produced;

FIG. 8 shows structures as recesses as opposed to elevations; and

Figure 9A:
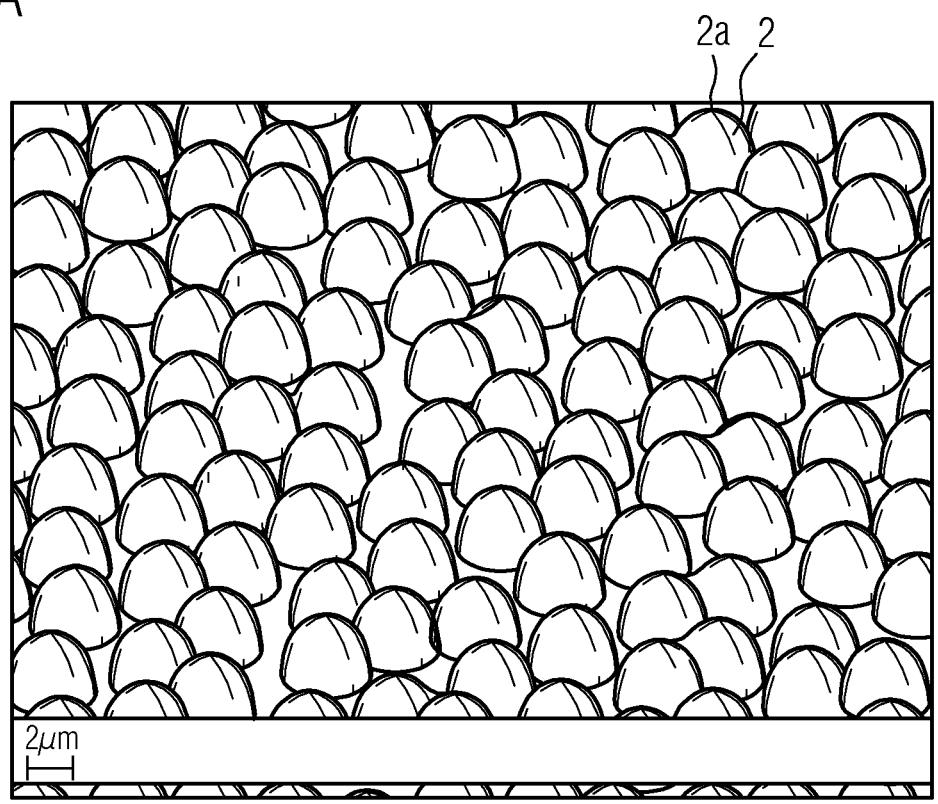
Figure 9B:
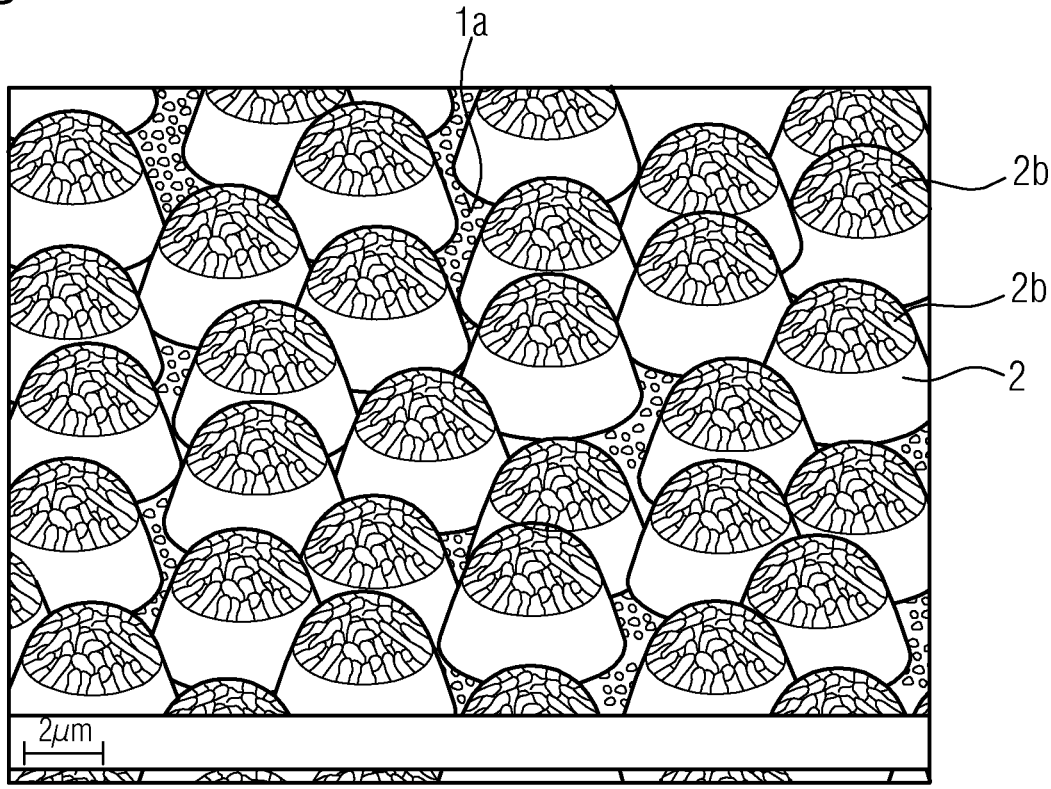
Figure 9C:
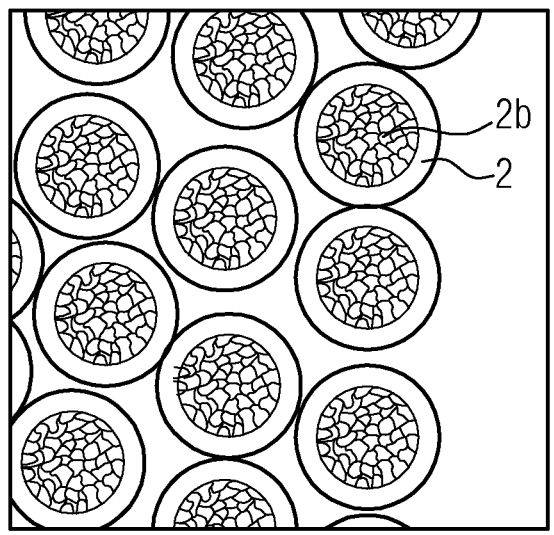

FIGS. 9A-9C show SEM micrographs at different viewing angles and resolutions for semiconductor chips.

DETAILED DESCRIPTION

FIG. 1A shows a schematic sectional illustration of a semiconductor chip described here including a semiconductor body 1. The semiconductor body 1 includes a first region 11, which is embodied as p-conducting, for example, a second region 13, which is embodied as n-conducting, for example, and an active region 12, in which electromagnetic radiation, for example light, is generated during operation. The electromagnetic radiation leaves the semiconductor body 1 at least partly through the radiation passage surface 1a.

Structures 2 having vertices 2a are formed at the radiation passage surface 1a. In the present case, the structures 2 are introduced into the material of the semiconductor body 1 and can consist, in particular, of the material of the semiconductor body 1. They can thus be monolithically integrated into the semiconductor body 1. The structures form a roughening of the semiconductor body 1 at the radiation passage surface.

The structures 2 are arranged in quasi-regular fashion. "In quasi-regular fashion" can mean, for example, that the positions x, y of at least some, in particular all, of the structures 2 are displaced in comparison with the positions of the structures at lattice points of a regular lattice, for example of a two-dimensional rectangular lattice or of a two-dimensional triangular lattice.

FIG. 1B schematically shows a plan view of the radiation passage surface 1a of the semiconductor body 1 shown in FIG. 1A. The dots P1 show there the positions of the vertices 2a of the structures 2 for the case of a regular lattice. The crosses "x" denote the positions P2 of the vertices 2a after a random displacement. Furthermore, FIG. 1B illustrates the average distance a between mutually adjacent lattice points of the regular lattice, in particular a lattice constant of the lattice. Furthermore, the illustration shows the maximum value m of the displacement of a structure in comparison with the regular, in particular periodic, case. The maximum value m defines a circle around each position P1 in the regular lattice within which a displacement can take place.

The left-hand part of FIG. 2A shows the weighting function w as a function of the lateral direction phi in angular degrees. It is evident from this illustration that the probability for a displacement in each lateral direction is chosen to be of equal magnitude. The right-hand part of FIG. 2A shows the weighting function for the distance r, which rises along a straight line from zero for a displacement of zero up to a maximum value for a displacement r=m. This weighting function stipulates that a displacement by a larger distance r2 takes place with a greater probability than a displacement by a smaller distance r1.

FIG. 2B shows a simulation of the mask 3 with a randomized structure, said simulation resulting from the illustrations in FIG. 2A. The maximum displacement m of the mask structures 20 from the periodic initial position is 20% of the average distance a in the regular case. That is to say that on the basis of, for example, the weighting functions w described and a predefined regular, periodic arrangement of structures, the displaced positions of the mask structures 20 are calculated and the mask 3 that is usable for photolithography is produced on the basis of this calculation. The mask structures 20 are subsequently transferred into a photoresist layer.

A cylindrical photoresist structure then arises on the semiconductor body 1 for each structure 2 to be produced. Afterward, the structures 2 are produced by means of dry-chemical etching. In this case, as the etching duration increases, the photoresist structures become smaller and smaller; their diameter and their height decrease. This gives rise to structures 2 which, for example, are domed and have a vertex 2a.

FIG. 3 shows an illustration of a finished mask design of a mask 3, on the basis of FIGS. 2A and 2B.

The first line in FIG. 4 shows the result of the dry-chemical etching as an SEM micrograph at different resolutions and viewing angles using the mask 3 from FIG. 3. The structures 2 are arranged in quasi-regular fashion.

The second line in FIG. 4 shows the result of dry-chemical etching as an SEM micrograph at different resolutions and viewing angles for comparison in the case of a regular arrangement. The structures 2 are arranged in regular fashion.

FIG. 5 shows the significant improvement in the emission on a wafer in the case of a quasi-regular arrangement in accordance with the mask from FIG. 3 in comparison with a regular arrangement. In the example, the edges of the wafer are arranged at positions 0 and 110. The center of the wafer is situated approximately at the position 58. The side to the left of the vertical line relates to the periodically, regularly structured case, and the side to the right of the line relates to the randomized, quasi-periodic case. The quasi-regular arrangement of the structures results in a homogenization of the emission over the wafer in comparison with the regular arrangement of the structures. In contrast to the regular case, the normalized brightness h, plotted in arbitrary units, is virtually constant over the wafer.

Embodiments of a method described here and of a semiconductor chip described here are explained in greater detail in association with the schematic sectional illustrations in FIGS. 6A and 6B.

FIG. 6A illustrates in the sectional illustration a structure 2 having a flattened vertex 2a. By way of example, this structure can be produced by eroding the vertex by means of a further phototechnology. For this purpose, the structures can be embedded into a resist layer in such a way that the vertex of the structures projects from the resist layer. The vertices are subsequently eroded by etching, for example.

FIG. 6A additionally illustrates that the structures 2 can be covered at their outer surface with an antireflective layer 4, which directly adjoins the structures and increases the probability of electromagnetic radiation emerging through the structures 2.

In contrast to FIG. 6A, FIG. 6B illustrates a structure 2 having a vertex 2a. That is to say that in this case the vertex 2a is not flattened, rather the structures maintain the original vertex, which is not eroded.

FIG. 7A illustrates base surfaces 2c of structures such as can be produced in embodiments of methods described here. By way of example, the structures can have triangular, see FIG. 7A, or hexagonal, see FIG. 7B, shaped base surfaces. In this case, the base surfaces run parallel to a principal plane of extent of the semiconductor body. The base surfaces can be produced for example by a correspondingly structured mask in conjunction with wet-chemical production of the structures. That is to say that the structures are defined by means of phototechnology, but then structured wet-chemically, such that for example specific crystal faces of the semiconductor body are transferred into the structure.

The schematic sectional illustration in FIG. 8 shows structures 2 which are not given by elevations, but rather by recesses. The recesses can have for example shapes which are the inverse of the shapes described in association with FIGS. 6A and 6B. The vertex of the structures is situated where the side surfaces of the structures converge in a local minimum, said vertex forming the deepest point in the structure in the case of the recess. In this case, the vertex 2a of the structure 2 defines the position of the structure around which the structure extends in lateral directions. In this case, the structures in FIG. 8 are likewise arranged in quasi-regular fashion.

FIGS. 9A, 9B and 9C show SEM micrographs at different viewing angles and resolutions for embodiments of semiconductor chips described here. In the embodiment in FIG. 9A, the structures 2 have smooth outer surfaces 2b. In the embodiment in FIGS. 9B and 9C, the structures 2 have a roughened outer surface 2b in the region of the vertex 2A. By way of the roughening, substructures are applied both onto the structures 2 and into the semiconductor body between the structures 2. The probability of total internal reflection when light emerges from the semiconductor body is reduced in this way. In this case, the roughened surface 2b can be implemented for example by means of subsequent wet-chemical etching of the semiconductor body 1 and of the structures 2.

The priorities of the German applications DE 102017120493.8, DE 102017121028.8 and 102018107615.0 are claimed, the disclosure content of which is hereby incorporated by reference.

The invention is not restricted to the embodiments by the description on the basis of said embodiments. Moreover, the invention encompasses any novel feature and also any combination of features, which in particular includes any combination of features in the patent claims, even if this feature or this combination itself is not explicitly specified in the patent claims or embodiments.

LIST OF REFERENCE SIGNS 1 semiconductor body
1a radiation passage surface, for example radiation exit surface
11 first region, for example p-conducting region
12 active region, for example light-generating region
13 second region, for example n-conducting region
2 structure, for example elevation, dome or recess
2a vertex of a structure
2b roughened outer surface of a structure
2c base surface of a structure
20 mask structure
3 mask
4 antireflective layer
x, y position of the structure
P1 position in the regular lattice
P2 position after the displacement
m maximum value of the displacement of a structure in comparison with the regular, in particular periodic, case
phi lateral direction
a average distance between mutually adjacent lattice points of the regular lattice, in particular lattice constant of the lattice
w weighting function
h normalized brightness in arbitrary units
X position on the wafer

The invention claimed is:

1. A method for producing an optoelectronic semiconductor chip;
wherein the method comprises:
providing a semiconductor body having a radiation passage surface, and
introducing structures into the semiconductor body at the radiation passage surface, and/or applying structures to the semiconductor body at the radiation passage surface, and/or exposing structures in the semiconductor body at the radiation passage surface,
wherein:
the structures are arranged in quasi-regular fashion;
positions of at least some of the structures are displaced in comparison with positions of structures at lattice points of a regular lattice, and said positions are arranged by a predefined maximum displacement value at a higher frequency than by a smaller displacement value where the smaller displacement value is greater than zero;
the structures are domes, elevations, or combinations thereof; and
each structure has a vertex where the position of each structure is given by the position of its vertex.

2. The method of claim 1,
wherein the maximum value is at least 10% of the average distance between mutually adjacent lattice points of the regular lattice.

3. The method as claimed in claim 1,
wherein the positions are displaced in each lateral direction with the same frequency.

4. The method of claim 1,
further comprising forming the structures by dry-chemical etching using a correspondingly structured mask.

5. The method of claim 1,
further comprising forming the structures by wet-chemical etching using a correspondingly structured mask.

6. The method of claim 1,
wherein the structures have a refractive index less than the refractive index of a region of the semiconductor body that directly adjoins the structures, and wherein the structures have a refractive index greater than the refractive index of a material surrounding the semiconductor body.

7. The method of claim 1,
wherein the height and/or the maximum diameter and/or the volume are/is different in pairs for at least some of the structures.

8. The method of claim 1,
wherein the height and/or the maximum diameter and/or the volume, for at least some of the structures, deviate(s) by at least 1% from an average value of the height and/or the maximum diameter and/or the volume.

9. The method of claim 1,
wherein at least some of the structures are covered with an antireflective layer.

10. The method of claim 1,
wherein at least some of the structures have a roughened outer surface only in the region of the vertex.

11. The method as claimed in claim 1, wherein the smaller displacement value is at least half of the maximum displacement value.

12. An optoelectronic semiconductor chip comprising:
a semiconductor body comprising a radiation passage surface and structures at the radiation passage surface, wherein:
the structures are arranged in quasi-regular fashion; and
positions of at least some of the structures are displaced in comparison with positions of structures at lattice points of a regular lattice, and said positions are arranged by a predefined maximum displacement value at a higher frequency than by a smaller displacement value where the smaller displacement value is greater than zero; and
the structures are domes, elevations, or combinations thereof; and
each structure has a vertex where the position of each structure is given by the position of its vertex.

13. The optoelectronic semiconductor chip of claim 12, wherein the maximum value is at least 10% of the average distance between mutually adjacent lattice points of the regular lattice.

14. The optoelectronic semiconductor chip of claim 12, wherein the positions are displaced in each lateral direction with the same frequency.

15. The optoelectronic semiconductor chip of claim 12, further comprising forming the structures by dry-chemical etching using a correspondingly structured mask.

16. The optoelectronic semiconductor chip of claim 12, further comprising forming the structures by wet-chemical etching using a correspondingly structured mask.

17. The optoelectronic semiconductor chip of claim 12, wherein the smaller displacement value is at least half of the maximum displacement value.

* * * * *

UNITED STATES PATENT AND TRADEMARK OFFICE
CERTIFICATE OF CORRECTION

| | |
|---|---|
| PATENT NO. | : 11,476,389 B2 |
| APPLICATION NO. | : 16/644962 |
| DATED | : October 18, 2022 |
| INVENTOR(S) | : Michael Huber |

It is certified that error appears in the above-identified patent and that said Letters Patent is hereby corrected as shown below:

On the Title Page

Item (57) ABSTRACT should read:
A method for producing an opto-electronic semiconductor chip may include providing a semiconductor body having a radiation passage surface, and introducing structures into the semiconductor body at the radiation passage surface, and/or applying the structures at the radiation passage surface, and/or exposing the structures at the radiation passage surface. The structures may be arranged in quasi-regular fashion. Positions of at least some of the structures are displaced in comparison with positions of structures at lattice points of a regular lattice. The positions are displaced by a larger distance with a greater probability than by a smaller distance.

Signed and Sealed this
Twenty-fourth Day of January, 2023

Katherine Kelly Vidal
*Director of the United States Patent and Trademark Office*